(12) United States Patent
Morii

(10) Patent No.: US 7,591,699 B2
(45) Date of Patent: Sep. 22, 2009

(54) METHOD OF MANUFACTURING LIGHT-EMITTING ELEMENT INCLUDING THE EMISSION LAYER AND THE CARRIER TRANSFER LAYER

(75) Inventor: Katsuyuki Morii, Lausanne (CH)

(73) Assignee: Seiko Epson Corporation, Tokyo (JP)

( * ) Notice: Subject to any disclaimer, the term of this patent is extended or adjusted under 35 U.S.C. 154(b) by 232 days.

(21) Appl. No.: 11/331,236

(22) Filed: Jan. 13, 2006

(65) Prior Publication Data

US 2006/0158106 A1 Jul. 20, 2006

(30) Foreign Application Priority Data

Jan. 14, 2005 (JP) ............................. 2005-008407

(51) Int. Cl.
*H01L 31/0312* (2006.01)
*H01J 17/49* (2006.01)
*G09G 3/28* (2006.01)

(52) U.S. Cl. .......................... 445/24; 313/504; 313/506; 313/507; 445/25; 257/77

(58) Field of Classification Search ................. 313/504, 313/507, 506; 427/272, 256, 372.2; 445/23, 445/24, 25; 438/149, 151; 257/40
See application file for complete search history.

(56) References Cited

U.S. PATENT DOCUMENTS

| | | | | |
|---|---|---|---|---|
| 6,391,471 B1 * | 5/2002 | Hiraoka et al. | ............... | 428/623 |
| 6,625,901 B1 * | 9/2003 | Mehmandoust et al. | ....... | 34/476 |
| 6,949,328 B2 * | 9/2005 | Ito et al. | ...................... | 430/321 |
| 7,288,420 B1 * | 10/2007 | Yamazaki et al. | ............. | 438/29 |
| 2002/0034626 A1 * | 3/2002 | Liu et al. | .................. | 428/312.6 |
| 2003/0044645 A1 * | 3/2003 | Kambe et al. | ................ | 428/690 |
| 2003/0151650 A1 * | 8/2003 | Masuda et al. | ................ | 347/96 |
| 2005/0025881 A1 * | 2/2005 | Daniels | ....................... | 427/66 |
| 2005/0079277 A1 * | 4/2005 | Takashima et al. | ............ | 427/58 |
| 2006/0134317 A1 * | 6/2006 | Yang et al. | ..................... | 427/78 |
| 2006/0142520 A1 * | 6/2006 | Jones et al. | .............. | 526/328.5 |
| 2006/0222758 A1 * | 10/2006 | Taka et al. | ..................... | 427/66 |

\* cited by examiner

*Primary Examiner*—Sikha Roy
*Assistant Examiner*—Tracie Green
(74) *Attorney, Agent, or Firm*—Oliff & Berridge

(57) ABSTRACT

Methods of manufacturing light-emitting elements including providing an emissive layer and a carrier transfer layer between a pair of electrodes, the carrier transfer layer mainly made of an organic polymer and contacting the emissive layer, performing an affinity improvement treatment to a face of a first electrode of the pair of electrodes on which the carrier transfer layer is formed, forming a liquid film by providing a liquid material containing a constituent material of the emissive layer, the organic polymer and a fluid medium to the face of the first electrode and separating the organic polymer on the first electrode side, and separating the constituent material of the emissive layer on a second electrode side of the pair of electrodes while removing the fluid medium from the liquid film, wherein the carrier transfer layer and the emissive layer are simultaneously formed.

24 Claims, 6 Drawing Sheets

METHOD OF MANUFACTURING LIGHT-EMITTING ELEMENT INCLUDING THE EMISSION LAYER AND THE CARRIER TRANSFER LAYER

CROSS-REFERENCE TO RELATED APPLICATION

The present application claims priority to Japanese Patent Application No. 2005-008407 filed Jan. 14, 2005, which is hereby expressly incorporated by reference herein in its entirety.

BACKGROUND OF THE INVENTION

1. Technical Field

The present invention relates to a method of manufacturing a light-emitting element, a light-emitting element, a display device and electronic equipment.

2. Related Art

With an organic electroluminescence element (hereinafter called "organic EL element") having at least a single luminescent organic layer (an organic electroluminescence layer) interposed between a cathode and an anode, it is possible to significantly reduce a level of an applied voltage compared with that of an inorganic EL element. It is also possible to make elements that produce various luminescent colors. Examples of related art are as follows: Appl. Phys. Lett. 51 (12), 21 Sep. 1987, p. 913, Appl. Phys. Lett. 71 (1), 7 Jul. 1997, p. 34, Nature 357,477 1992, JP A-10-153967, JP A-10-12377 and JP A-11-40358.

There is active research on high efficiency organic EL elements, developing and improving material, and proposing various device structures.

In this field of the organic EL element, elements producing various luminescent colors and high luminance or high efficiency elements have been developed. These elements are proposed to be used in various applications such as picture elements and a light source in a display device.

There have been various kinds of research and development, aiming to further improve luminous efficiency in order to turn the EL element into actual utilization.

SUMMARY

An advantage of the invention is to provide a method of manufacturing a light-emitting element with a fine luminous efficiency, a light-emitting element manufactured by the method thereof, and a highly reliable display device and electronic equipment having this light-emitting element.

According to a first aspect of the invention, a method of manufacturing a light-emitting element includes a step of providing an emissive layer and a carrier transfer layer between a pair of electrodes, the carrier transfer layer mainly made of an organic polymer and contacting with the emissive layer, a step of performing an affinity improvement treatment to a face of a first electrode of the pair of electrodes on which the carrier transfer layer is formed in order to improve the affinity of the organic polymer, step of forming a liquid film by providing a liquid material containing a constituent material of the emissive layer, the organic polymer and a fluid medium to the face of the first electrode on which the carrier transfer layer is formed and a step of separating the organic polymer on the first electrode side, and separating the constituent material of the emissive layer on a second electrode side of the pair of electrodes while removing the fluid medium from the liquid film. The carrier transfer layer and the emissive layer are simultaneously formed.

According to the first aspect of the invention, it is possible to securely separate and form the electron hole transfer layer and the emissive layer. Consequently, the light-emitting element with a high luminous efficiency can be manufactured.

It is preferable that the affinity improvement treatment is a chemical modification process in which a chemical structure having a part of chemical compounds composing the organic polymer is introduced in the face of the first electrode on which the carrier transfer layer is formed.

In this way, it is possible to assuredly separate and form the electron hole transfer layer and the emissive layer.

It is also preferable that the carrier transfer layer is an electron hole transfer layer.

In this way, it is possible to manufacture the light-emitting element excel in the luminous efficiency by adopting the hole transfer layer as the carrier transfer layer.

It is preferable that the electron hole transfer layer has a first region mainly made of a first organic polymer on the first electrode side and a second region mainly made of a second organic polymer that is different polymer from the first organic polymer on the emissive layer side, and the affinity improvement treatment that is a treatment of improving the affinity of the first organic polymer is performed to a face of the first electrode on which the emissive layer is formed.

In this way, it is possible to assuredly separate and form the first region and the second region.

Furthermore, it is preferable that the first region and the second region are formed together with the emissive layer by a phase separation method.

In this way, the first region and the second region can sufficiently exert their function. In addition, the electron holes are smoothly transferred from the first region to the second region since these boundary faces closely contact each other.

It is preferable that a weight-average molecular weight of the first organic polymer is larger than a weight-average molecular weight of the second organic polymer.

In this way, the orientation of the second region can be increased, improving the transport efficiency of the electron holes. At the same time, the first region can become amorphous state, lessening the possibility of forming crystal grains. Therefore, it can prevent a phenomenon of hole transfer among crystal grain boundaries from occurring. Accordingly, it is possible to prevent the anode and the emissive layer from being short-circuited because the phenomenon will not be intensified with time. Consequently, the light-emitting element can have a fine luminous efficiency and a high durability.

Moreover, it is preferable that the weight-average molecular weight of the first organic polymer is equal to or larger than 10,000.

In this way, the first region more surely becomes amorphous state. This makes it possible to more credibly prevent the anode and the emissive layer from being short-circuited with time.

It is also preferable that the weight-average molecular weight of the second organic polymer is equal to or smaller than 8,000.

By using the second organic polymer with low molecular weight, the orientation of the second region is enhanced, increasing the transport efficiency in the second region.

Furthermore, it is preferable that the first organic polymer is polyallylamine, fuluorene-allylamine copolymer or these derivatives because they have a fine hole injection efficiency.

It is also preferable that the second organic polymer is polyfluorene, fuluorene-bithiophene copolymer or these derivatives because they have a fine hole transfer capability.

Moreover, it is preferable that the emissive layer is a complex mainly consisting of an inorganic semiconductor material and a light emitting material.

In this way, it is possible to further improve the duration of the emissive layer, extending a life of the light-emitting element.

At least a part of the inorganic semiconductor material of the complex may be coated with the light emitting material.

In this way, the contact area of the hole transfer layer and the light emitting material is increased and it is possible to enlarge the luminous site.

The inorganic semiconductor material is preferably made of metal oxide as a main constituent.

The inorganic semiconductor material mainly made of the metal oxide has a good durability and a fine electron transport capability.

More particularly, zirconium oxide is preferable among the metal oxides.

The inorganic semiconductor material mainly made of the zirconium oxide has a good durability and a fine electron transport capability.

Furthermore, the inorganic semiconductor material is preferably made in the particulate form.

In this way, the contact area of the emissive layer (the light emitting material) and the hole transfer layer increases and the above-described advantageous effects of the area increase can be exerted.

In this case, an average diameter of the inorganic semiconductor particle (particulate inorganic semiconductor material) is preferably about 0.5-10 nm.

In this way, the contact area of the emissive layer and the hole transfer layer can be sufficiently secured.

The light emitting material is preferably made of a metal complex because the light emitting material that mainly consists of the metal complex has a fine durability and a fine luminous efficiency.

Moreover, a complex having iridium as a center metal is preferably used as a main constituent material of the light emitting material. The light emitting material that mainly consists of the metal complex the iridium complex has a fine durability and a fine luminous efficiency.

Furthermore, it is preferable that the fluid medium is removed in an atmosphere containing a vapor of a polar solvent.

In this way, it is possible to assuredly collect the complex on the second electrode side in the liquid film.

It is also preferable that the fluid medium is removed while convection is generated in the liquid film.

In this way, it is possible to assuredly collect the complex on the second electrode side in the liquid film.

In this case, it is preferable that the convection is generated by heating the liquid film.

It is relatively easy to adjust (control) the convection in the liquid film by heating.

According to a second aspect of the invention, a light-emitting element is manufactured by the above-described manufacturing method.

In this way, it is possible to obtain the light-emitting element with the high luminous efficiency.

According to a third aspect of the invention, a display device includes the above-mentioned light-emitting element.

In this way, it is possible to obtain a highly reliable display device.

According to a fourth aspect of the invention, electronic equipment includes the above-mentioned display device.

In this way, it is possible to obtain a highly reliable electronic equipment.

BRIEF DESCRIPTION OF THE DRAWINGS

The invention will be described with reference to the accompanying drawings, wherein like numbers reference like elements.

DESCRIPTION OF THE EMBODIMENTS

Embodiments of a method of manufacturing a light-emitting element, a light-emitting element, a display device and electronic equipment according to the invention will now be described with reference to the drawings.

Figure 1:
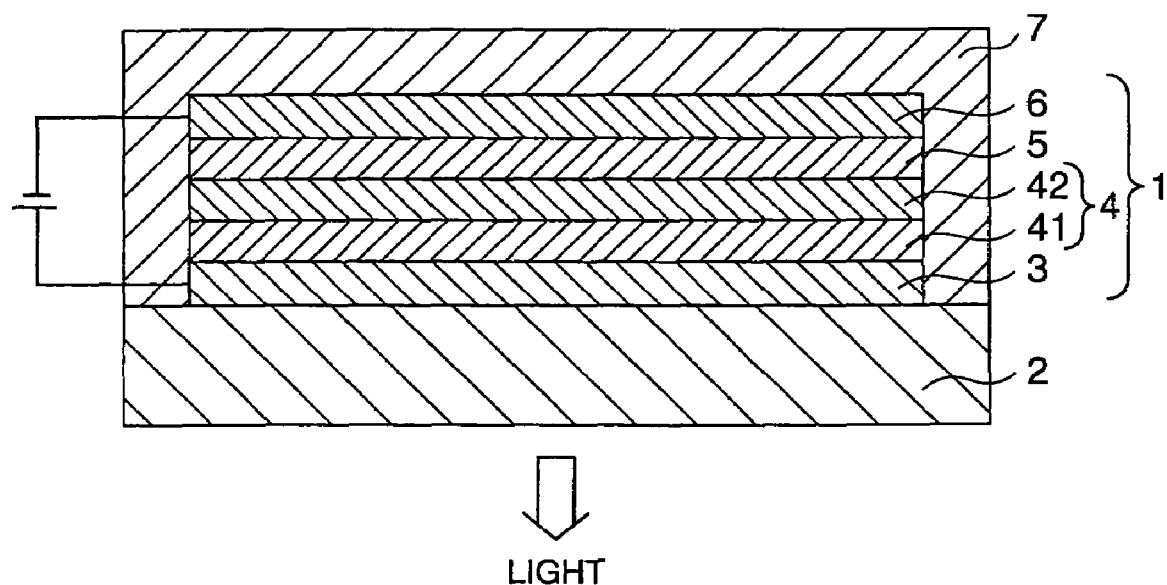
FIG. 1 is a schematic longitudinal sectional view of a light-emitting element according to an embodiment of the present invention.
Figure 2:
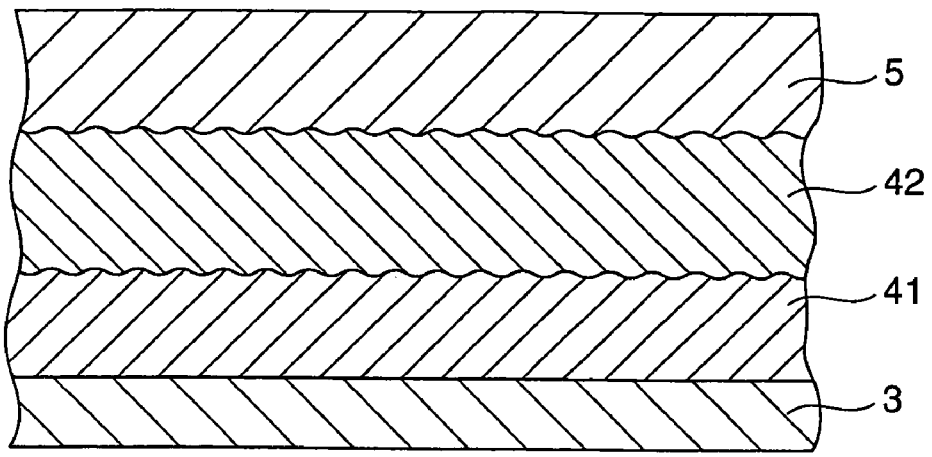
FIG. 2 is a schematic view showing areas around interfaces of components (layers) of the light-emitting element shown in FIG. 1.
Figure 3:
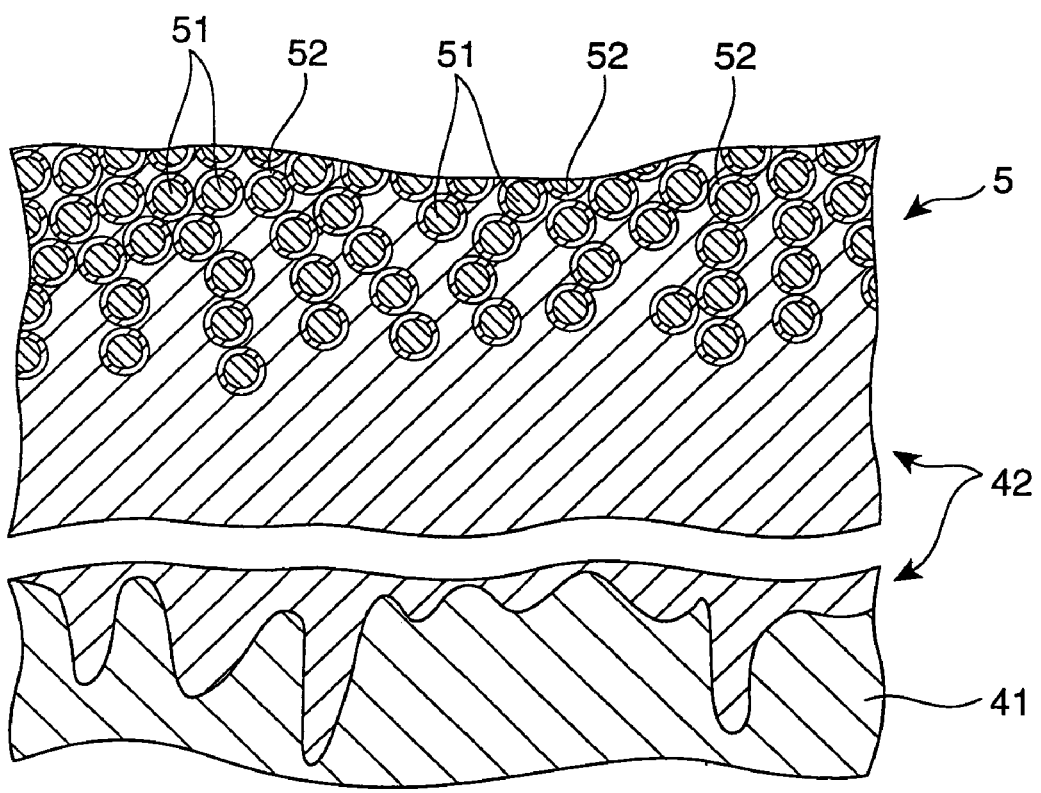
FIG. 3 is an enlarged view of FIG. 2.

FIG. 1 is a schematic longitudinal sectional view of a light-emitting element according to an embodiment of the invention, FIG. 2 is a schematic view showing areas around interfaces of components (layers) of the light-emitting element shown in FIG. 1, and FIG. 3 is an enlarged view of FIG. 2. In the following description, the upper side in FIGS. 1 through 3 is "topside" and the lower side in the FIGS. 1 through 3 is "downside" for convenience of explanation.

A light-emitting element 1 (electroluminescence element) shown in FIG. 1 has an anode 3 (a first electrode), a cathode 6 (a second electrode), a hole transfer layer 4 (a carrier transfer layer) and an emissive layer 5 interposed between the anode 3 and the cathode 6 on a substrate 2. The hole transfer layer 4 is provided on the anode 3 side and the emissive layer 5 is provided on the cathode 6 side. The anode 3, the hole transfer layer 4, the emissive layer 5 and the cathode 6 are sealed with a sealing member 7.

The substrate 2 is a supporting member for the light-emitting element 1. The light-emitting element 1 in this embodiment has a structure (bottom-emission type) in which light is taken out from the substrate 2 side. Therefore, the substrate 2 and the anode 3 are substantially transparent (colorless and clear, colored and clear, or translucence).

As material for the substrate 2, for example, resin materials such as polyethylene terephthalate, polyethylene naphthalate, polypropylene, cycloolefin polymer, polyamide, polyether sulfone, polymethyl methacrylate, polycarbonate and polyarilate, or glass materials such as quartz glass and soda glass and the like can be used. One of the above-mentioned material or combination of more than one kind of the above-mentioned materials may be used.

Average thickness of the substrate 2 is not particularly limited. However, it is preferable that the thickness is within a range of 0.1-30 mm, especially, 0.1-10 mm.

When the light-emitting element 1 is a top-emission type in which the light is taken out from the opposed side to the substrate 2, either a transparent substrate or an opaque substrate can be used as the substrate 2.

As the opaque substrate, for example, a substrate made of ceramic material such as alumina, a metal substrate such as stainless steel on which an oxide film (an insulating film) is formed, a substrate made of resin material and the like can be used.

The anode 3 is an electrode that injects electron holes into the hereinafter described hole transfer layer 4. It is preferable that the anode 3 is made of material with a large work function and a high conductivity.

For example, oxides such as indium tin oxide (ITO), indium zinc oxide (IZO), $In_3O_3$, $SnO_2$, Sb-containing $SnO_2$ and Al-containing ZnO, Au, Pt, Ag, Cu and the like can be used for the anode 3. Alloy containing the above-mentioned material can also be used. In addition, one or more than one of the above-mentioned materials combined may also be adopted.

An average thickness of the anode 3 is not particularly limited. However, it is preferable that the thickness is 10-200 nm, especially, 50-150 nm.

The cathode 6 is an electrode that injects electrons into the hereinafter described emissive layer 5. It is preferable that the cathode 6 is made of material with a small work function.

For example, Li, Mg, Ca, Sr, La, Ce, Er, Eu, Sc, Y, Yb, Ag, Cu, Al, Cs and Rb can be used for the cathode 6. Alloys containing the above-mentioned material can also be used. In addition, one or more than one of the above-mentioned materials combined may also be adopted (for example, multi-layered member consisting of the above-mentioned materials).

Especially, when the alloy is used to form the cathode 6, an alloy containing a stable metal element such as Ag, Al and Cu is preferable. More specifically, alloys such as MgAg, AlLi and CuLi are preferable. It is possible to improve electron injection efficiency and stability of the cathode 6 by employing such alloys as the cathode 6.

An average thickness of the cathode 6 is not particularly limited. However, it is preferable that the thickness is 100-10000 nm, especially, 200-500 nm.

The light-emitting element 1 in this embodiment is the bottom-emission type thereby the cathode 6 is not necessarily transparent.

A hole transfer layer 4 carries out a function of transferring the electron holes injected through the anode 3 to the emissive layer 5. This hole transfer layer 4 is mainly made of organic polymer.

Various kinds of p-type semiconductor materials can be used as the organic polymer. For example, there are polyallylamine, fuluorene-allylamine copolymer, fuluorene-bithiophene copolymer, poly (N-vinyl carbazole), polyvinyl pyrene, polyvinyl anthracene, polythiophene, polyalkylthiophene, polyhexylthiophene, poly (p-phenylene vinylene), polythienylene vinylene, pyrene formaldehyde resin, ethylecarbazole formaldehyde resin and these derivatives. One or more than one of the above-mentioned chemical compounds combined can also be used to form the hole transfer layer 4.

Furthermore, a mixture of the above-mentioned chemical compounds and other chemical compounds can also be used. For example, poly (3,4-ethylenedioxythiphene/styrenesulphonic acid) (PEDOT/PSS) and the like can be named as a mixture containing polythiophene.

The hole transfer layer 4 in this embodiment has a first region 41 that contacts with the anode 3 and a second region 42 that contacts with the emissive layer 5 as shown in FIG. 1 and FIG. 2.

The first region 41 is mainly formed of a first organic polymer and the second region 42 and the second region 42 is mainly formed of a second organic polymer that is a different kind of polymer from the first organic polymer. These regions 41 and 42 are formed at the same time together with the emissive layer 5 by a hereinafter-described phase separation (vertical phase separation) method.

Taking a broad view of the first region 41 and the second region 42, these boundary faces are substantially parallel to the upper face of the anode 3 as shown in FIG. 2. Taking a microscopic view, the boundary faces of the first region 41 and the second region 42 engage (overlap) each other in a convexo-concave form as shown in FIG. 3.

In this way, the first region 41 and the second region 42 can sufficiently exert their function. In addition, the electron holes are smoothly transferred from the first region 41 to the second region 42 since these boundary faces closely contact each other.

As for a combination of the first organic polymer and the second organic polymer, for example, the following two combinations can be used: (I) One with a high injection efficiency is for the first organic polymer and one with a high orientation and a high transport efficiency is for the second organic polymer (II) Use one with a larger band gap for the first organic polymer compared to that of the second organic polymer.

In the first case (I), the electron holes are effectively injected into the second region 42 through the first region 41 from the anode 3. In the second case (II), the electron holes are transferred in a cascade manner (smoothly) from the anode 3 to the emissive layer 5, in other words, the electron holes are efficiently transferred in the hole transfer layer 4. Accordingly, both cases (I) and (II) can improve the luminous efficiency of the light-emitting element 1.

In the first case (I), it is preferred that the first organic polymer is made of polyallylamine, fuluorene-allylamine copolymer or these derivatives. These compounds excel in the hole injection efficiency.

As an example of the polyallylamine derivative, triphenylamine-series polymer represented by Formula 1 shown below can be named.

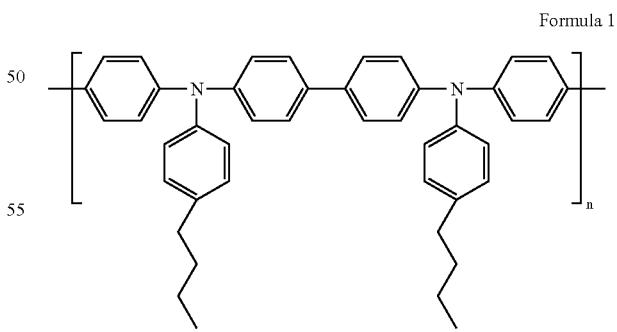

Formula 1

It is preferred that the second organic polymer is made of polyfluorene, fuluorene-bithiophene copolymer or these derivatives. These compounds has a fine hole transfer capability.

Polyfluorene series polymer represented by Formula 2 shown below is an example of the polyfluorene derivative.

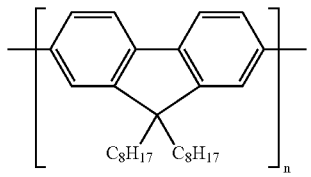

Formula 2

Furthermore, in the first case (I), it is preferred that one with a relatively low molecular weight is selected for the second organic polymer and one with a larger weight-average molecular weight (relatively large molecular weight) than that of the second organic polymer is selected from the first organic polymer. Accordingly, the following advantageous effects can be obtained. The orientation of the second region 42 is increased, improving the transport efficiency of the electron holes. The first region 41 becomes amorphous state, lessening the possibility of forming crystal grains. Therefore, it can prevent a phenomenon of hole (carrier) transfer among crystal grain boundaries (among crystal grains) from occurring. Accordingly, it is possible to prevent the anode 3 and the emissive layer 5 from being short-circuited because the phenomenon will not be intensified with time. Consequently, the light-emitting element 1 has a fine luminous efficiency and a high durability.

In this case, it is preferred that the weight-average molecular weight of the first organic polymer is 10000 or more, more preferably, about 15000-50000. In this way, the first region 41 definitely becomes amorphous and this can surely prevent the short circuit between the anode 3 and the emissive layer 5 by aging.

As for the second organic polymer, its weight-average molecular weight is preferably 8000 or less, more preferably, about 1500-5000. By using the second organic polymer with low molecular weight, the orientation of the second region 42 is enhanced, increasing the transport efficiency in the second region 42.

Moreover, by combining the first organic polymer and the second organic polymer having the above-mentioned molecular weight, the first region 41 and the second region 42 can be securely separated and formed with the hereinafter described phase separation. At the same time, the second region 42 is securely formed and separated from the emissive layer 5.

An average thickness of the hole transfer layer 4 (the first region 41 and the second region 42 combined) is not especially limited. However, it is preferably 10-150 nm, more particularly about 50-100 nm.

Though the hole transfer layer 4 has the two region made of different organic polymers in this embodiment, it is obvious for those who skilled in this art that the hole transfer layer 4 may be made of a single organic polymer as a main constitution material.

The emissive layer 5 is provided so as to contact with the hole transfer layer 4 (the second region 42 ). The emissive layer 5 transfers the electrons injected from the cathode 6 and receives the electron holes from the hole transfer layer 4. The electron holes and the electrons recombine around the boundary face of the hole transfer layer 4, excitons are generated by the energy released at the recombination, and energy (fluorescence or phosphorescence) is released (emitted) when the excitons return to the ground state.

As described above, this emissive layer 5 is formed by the phase separation (vertical phase separation) together with the first region 41 and the second region 42.

Taking a broad view of the first region 41 and the second region 42, these boundary faces are substantially parallel to the upper face of the anode 3 as shown in FIG. 2. Taking a microscopic view, the boundary faces of the first region 41 and the second region 42 engage (overlap) each other in a convexo-concave form as shown in FIG. 3.

Thereby, an contact area of the emissive layer 5 and the hole transfer layer 4 increases. This expands a recombination site of the electrons and the holes. Since this recombination site exits in an area which is detached from the electrodes (the anode 3 and the cathode 6), as a result, an area where emits light is expanded (the number of the molecules that contribute to light generation increases). Consequently, it is possible to further improve the luminous efficiency and the duration of the light-emitting element 1.

In addition, the boundary face between the emissive layer 5 and the hole transfer layer 4 is not even (flat) but is formed in the convexo-concave pattern. This can prevent all the electron holes and the electrons from recombining concurrently even when a drive voltage is increased. It leads to avoid a sudden rise in the intensity of the light emission. Accordingly, luminosity of the light from the light-emitting element 1 and a tone in low brightness can be easily controlled because the luminosity can be moderately raised according to the drive voltage. Moreover, there is an advantage that a complicated peripheral circuit for precisely control of the drive voltage becomes unnecessary.

The emissive layer 5 in this embodiment is mainly a complex of inorganic semiconductor particle 51 (particulate inorganic semiconductor material) and a light emitting material 52. Though the whole of the inorganic semiconductor particle 51 shown in the figure is covered with the light emitting material 52, only a part of the inorganic semiconductor particle 51 may be coated with the light emitting material 52. In this way, the surface of the inorganic semiconductor particle 51 is coated with the light emitting material 52, and the contact area of the hole transfer layer 4 and the light emitting material 52 is increased. Thereby, it is possible to enlarge the luminous site.

In such emissive layer 5, the electrons are supplied to the light emitting material 52 through the inorganic semiconductor particle 51 and the light emitting material 52 emits light. In other words, aggregation of the inorganic semiconductor particles 51 can also be called as an electron transport layer.

As described above, it is possible to improve the durability of the emissive layer 5 and the duration of the light-emitting element 1 by using the inorganic semiconductor material for the constituent material of the emissive layer 5.

As such inorganic semiconductor material, for example, there are metal oxide such as $ZrO_2$, $TiO_2$, $TiO$, $Ti_2O_3$, $NbO$, $SrTiO_3$, $ZnO$, $SiO_2$, $Al_2O_3$ and $SnO_2$, metal sulfide such as ZnS and CdS, metal selenide such as CdSe, metal or semiconductor carbide such as TiC and SiC, and semiconductor nitride such as $Si_3N_4$, $B_4N$ and BN. One or more than one of the above-mentioned materials combined (for example, in the form of mixture, solid solution and the like) may also be used.

Among the above-mentioned materials, the metal oxide is preferable as the inorganic semiconductor material. More particularly, $ZrO_2$ (zirconium oxide) is preferable among the metal oxides. The inorganic semiconductor material mainly made of the metal oxide (particularly, $ZrO_2$) has a good durability and a fine electron transport capability.

Furthermore, the inorganic semiconductor material is made in the particulate form in this embodiment. Thereby, the contact area of the emissive layer 5 (the light emitting material 52) and the hole transfer layer 4 increases and the above-described advantageous effects of the area increase can be exerted.

In this case, an average diameter of the inorganic semiconductor particle 51 (particulate inorganic semiconductor material) is preferably about 0.5-10 nm, more particularly, 1-7 nm. In this way, the contact area of the emissive layer 5 and the hole transfer layer 4 can be sufficiently secured. This can further improve the above-described advantageous effects.

As the light emitting material 52, for example, there is metal complex such as threefold coordinate iridium metal complex having 2,2'-bipyridine-4,4'-dicarboxylic acid (see Formula 3) as its ligand, fac tris (2-phenypyridine) iridium (Ir(ppy)$_3$), tris (8-hydroxyquinoline) aluminum (Alq$_3$), tris (4-methyl-8-quinolinolato) aluminum(III) (Almq$_3$), 8-hydroxyquinoline Zinc (Znq$_2$), (1,10-phenanthroline)-tris-(4,4,4-trifluoro-1-(2-thienyl)-butane-1,3-dionato) europium(III) (Eu(TTA)$_3$(phen)) and 2,3,7,8,12,13,17,18-octaethyl-21H, 23H-porphyrin platinum(II) (PtOEP). Moreover, there are benzene series compound such as distyrylbenzene (DSB) and diamino distyrylbenzene (DADSB), naphthalene series compound such as naphthalene and Nailered, phenanthrene series compound such as phenanthrene, chrysene series compound such as chrysene and 6-nitrochrysene, perylene series compound such as perylene and N,N'-bis (2,5-di-tert-butylphenyl)-3,4,9,10-perylenedicarboximide (BPPC), coronene series compound such as coronene, anthracene series compound such as anthracene and bisstyrylanthracene, pyrene series compound such as pyrene, pyran series compound such as 4-(dicyanomethylene)-2-methyl-6-(para-dimethylaminostyryl)-4H-pyran (DCM), acridine series compound such as acridine, stilbene series compound such as stilbene, thiophene series compound such as 2,5-dibenzoxazolethiophene, benzoxazole series compound such as benzoxazole, benzoimidazole series compound such as benzoimidazole, benzothiazole series compound such as 2,2-(paraphenylenedivinylene)-bisbenzothiazole, butadiene series compound such as bistyryl (1,4-diphenyl-1,3-butadiene) and tetraphenylbutadiene, naphthalimide series compound such as naphthalimide, coumarin series compound such as coumarin, perinone series compound such as perinone, oxadiazole series compound such as oxadiazole, aldazine series compound, cyclopentadiene series compound such as 1,2,3,4,5-pentaphenyl-1,3-cyclopentadiene (PPCP), quinacridone series compound such as quinacridone and quinacridone red, pyridine series compound such as pyrrolo-pyridine and thiadiazolo-pyridine, spiro compound such as 2,2',7,7'-tetraphenyl-9,9'-spirobifluorene, metal or metal-free phthalocyanine series compound such as phthalocyanine (H2Pc) amd cupper-phthalocyanine, fluorene series compound such as fluorene and the like. One or more than one of the above-mentioned materials combined may also be used.

Formula 3

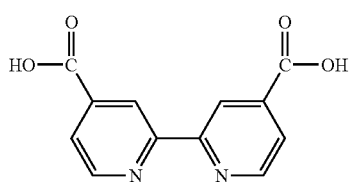

Among the above-mentioned materials, the metal complex is particularly preferable as the light emitting material 52. Moreover, among the metal complexes, a complex having iridium as a center metal (iridium complex) is preferably used as a main constituent material of the light emitting material 52. The light emitting material 52 that mainly consists of the metal complex (especially, the iridium complex) has a fine durability and a fine luminous efficiency.

An average thickness of the emissive layer 5 is not especially limited. However, it is preferably 1-100 nm, more particularly about 20-50 nm.

Instead of using the inorganic semiconductor material as a material contributing to the electron transfer, organic semiconductor material can also be used for the emissive layer 5. Alternatively, the emissive layer may be mainly made of the above-described light emitting material 52 (low molecular luminous material) without using the material contributing to the electron transfer.

Furthermore, the emissive layer 5 may be mainly made of polymer light emitting material. Again, an one kind of the organic polymer is used to form the hole transfer layer 4. The light emitting material and the organic polymer are appropriately selected. In this way, it is possible to simultaneously form the emissive layer 5 and the hole transfer layer 4 by the hereinafter described phase separation. In this case, for example, the organic polymer with a smaller weight-average molecular weight than that of the light emitting material should be selected As a polymer light emitting material, for example, there are polyacetylene series compound such as trans-polyacetylene, cis-polyacetylene, poly(di-phenylacetylene) (PDPA) and poly(alkyl-phenylacetylene) (PAPA), polyparaphenylene vinylene series compound such as poly(para-phenylene vinylene) (PPV), poly(2,5-dialkoxy-para-phenylenevinylene) (RO-PPV), cyano-substituted-poly(para-phenylene vinylene) (CN-PVV), poly(2-dimethyloctylsirile-1,4-phenylenevinylene) (DMOS-PPV) and poly(2-methoxy-5-(2'-ethylhexyloxy)-para-phenylene vinylene) (MEH-PPV), polythiophene series compound such as poly(3-alkylthiophene) (PAT) and poly(oxypropylene) triol (POPT), polyfluorene series compound such as poly(9,9-dialkylflourene) (PDAF), poly-(dioctylfluorene-art-benzothiadiazole) (F8BT), α,ω-bis [N,N-di(methylphenyl)ami-nophenyl]-poly [9,9-bis (2-ethylhexyl) fluoren-2,7-diyl] (PF2/6am4) and poly(9,9-dioctyl-2,7-divinylenefluorenyl-ortho-co(anthracene-9,10-diyl). Furthermore, there are also polyparaphenylene series compound such as poly(para-phenylene) (PPP) and poly(1,5-dialkoxy-para-phenylene) (RO-PPP), polycarbazole series compound such as poly(N-vinyl carbazole) (PVK), and polysilane series compound such as poly (methylphenysilane) (PMPS), poly(naphthyl phenylsilane) (PNPS) and poly(biphenylphenylsilane) (PBPS).

The sealing member 7 is provided so as to cover the anode 3, the hole transfer layer 4, the emissive layer 5 and the cathode 6. The sealing member 7 seals these components in a air-proof manner and shields against oxygen and water. By providing the sealing member 7, such advantageous effects as improvement in the credibility of the light-emitting element 1, prevention of alteration or deterioration (improvement of durability) and the like can be obtained.

As constituent material for the sealing member 7, for example, Al, Au, Cr, Nb, Ta, Ti and those alloys can be used. Oxide silicon, various kinds of resin materials and the like can also be adopted. When a conductive material is used as the constituent material for the sealing member 7, a insulating film is preferably provided between the sealing member 7 and the anode 3, the hole transfer layer 4, the emissive layer 5 and the cathode 6 as required in order to prevent short-circuit.

The sealing member 7 may be formed in a plate shape and provided so as to oppose the substrate 2. In this case, a sealing material such as thermo-setting resin, for example, is provided between and the substrate 2.

The above-described light-emitting element 1 can be manufactured, for example, in the way as described below.

1. Firstly, provide the substrate 2 and the anode 3 is formed on the substrate 2.

The anode 3 can be formed by applying, for example, a chemical vapor deposition (CVD) method such as plasma CVD, heat CVD and laser CVD, a vacuum deposition method, a sputtering method, a dry plating method such as ion-plating, a wet plating method such as electrolytic plating, dip plating and electroless plating, a spray method, a sol-gel method, metal-organic deposition (MOD) method, bonding of a metal foil and the like.

2. Next, an affinity improvement treatment (a first process), in which affinity (wettability) of the upper face (the face on which the hole transfer layer 4 is formed) of the anode 3 for the first organic polymer is improved, is performed.

In this way, the first organic polymer can be securely collected on the anode 3 side (the under side) in a liquid-form film in the next process (3). Accordingly, the first region 41, the second region 42 and the emissive layer 5 are securely formed and separated from one another.

For example, a chemical modification process in which a chemical structure (a building unit) including a part of the chemical compounds composing the first organic polymer is introduced is performed as the affinity improvement treatment. When the first organic polymer is hydrophilic, a hydrophilic treatment process in which hydrophilicity is given can also be performed as the affinity improvement treatment. However, the chemical modification process is more appropriate since the above-described advantageous effects can be further enhanced.

For example, when the first organic polymer has a triphenylamine skeleton (structure), the chemical modification process to introduce alkyl chain having an amino group, triphenylamine (allylamine), a phenyl group, a benzyl group and the like on its end into the surface of the anode 3 is performed.

When the anode 3 is mainly made of the metal oxide, a chemical compound (a coupling agent) that introduces the desired atom group to one end and trimethylsilane, methylsilane, trichlorosilane and the like to the other end can be used as a treatment agent (reagent) of the chemical modification process. When the anode 3 is mainly made of Au, Pt and the like, a chemical compound (a coupling agent) that introduces the desired atom group to one end and a thiol group and the like to the other end can be used as the treatment agent.

3. Next, the hole transfer layer 4 (the first region 41 and the second region 42) and the emissive layer 5 are simultaneously formed on the first region 41 by the phase separation method (a second process). This will be performed in the following way.

Firstly, the first organic polymer and the second organic polymer are dissolved in a solvent (a fluid medium). A liquid material is prepared by dispersing the complex of the inorganic semiconductor particle 51 and the light emitting material 52 in the solution of the organic polymers.

As the solvent, there are inorganic solvent such as nitric acid, sulfuric acid, ammonia, hydrogen peroxide, water, carbon disulfide, carbon tetrachloride and ethylene carbonate, ketone series solvent such as methylketone (MEK), acetone, diethylketone, methyl isobutyl ketone (MIBK), methyl isopropyl ketone (MIPK) and cyclohexane, alcohol series solvent such as methanol, ethanol, isopropanol, ethylene glycol, diethylene glycol (DEG) and glycerine, ether series solvent such as diethylether, diisopropylether, 1,2-dimethoxyethane (DME), 1,4-dioxan tetrahydrofuran (THF), tetrahydropyran (THP), anisole, diethyleneglycoldimethyl ether (diglyme) and diethylenglycoldiethyl ether (carbitol), cellosolve series solvent such as methyl cellosolve, ethyl cellosolve and phenyl cellosolve. Furthermore, there are aliphatic hydrocarbon series solvent such as hexane, pentane, heptane and cyclohexane, aromatic hydrocarbon series solvent such as toluene, xylene and benzene, heteroaromatic compound series solvent such as pyridine, pyrazine, furan, pyrrole, thiophene and methyl pyrrolidone, amid series solvent such as N,N-dimethyl formamide (DMF) and N,N-dimethyl acetamide, halogen compound series solvent such as chlorobenzene, dichloromethane, chloroform and 1,2-dichloroethane, ester series solvent such as acetic ether, methyl acetate and formic ether, sulfur compound series solvent such as dimethyl sulfoxide (DMSO) and sulfolane, nitrile series solvent such as acetonitrile, propionitrile and acrylonitrile, and organic acid solvent such as formic acid, acetic acid, trichloroacetic acid and trifluoroacetic acid and other various organic solvents. Mixed solvents containing the above-mentioned materials can also be used.

As the solvent, apolar solvents are appropriate among the above-mentioned solvents. As such apolar solvents, for example, there are aromatic hydrocarbon series solvent such as xylene toluene, cyclohexylbenzene, dihydrobenzofuran, trimethylbenzene and tetramethylbenzene, heteroaromatic compound series solvent such as pyridine, pyrazine, furan, pyrrole, thiophene and methyl pyrrolidone, and aliphatic hydrocarbon series solvent such as hexane, pentane, heptane and cyclohexane. One of these material, or more than one material combined can be used.

Next, the liquid film is formed by providing the liquid material on the anode 3.

As a method of providing the liquid material, for example, there are a spin-coat method, a casting method, a microgravure coat method, a bar coat method, a roll coat method, a wire-bar coat method, a dip coat method, a spray coat method, a screen printing method, a flexographic printing method, a offset printing method, an ink-jet printing method and other application methods. According to these application methods, it becomes relatively easy to form the first region 41.

Then, the solvent is removed from the liquid film. When the solvent is removed, the first organic polymer and the second organic polymer are separated and solidified in this order on the anode 3 side in the liquid film. At the same time, the complex is separated and solidified on the cathode 6 side. Accordingly, the first region 41, the second region 42 and the emissive layer 5 are formed. In other words, the first region 41, the second region 42 and the emissive layer 5 are simultaneously formed by the phase separation.

The condition of the phase separation between the complex and the first organic polymer and the second organic polymer can be controlled by adequately setting at least one of the following parameters: kinds of the solvent, the weight-average molecular weight of the first organic polymer, the weight-average molecular weight of the second organic polymer, the first organic polymer content of the liquid material, the second organic polymer content of the liquid material, the complex (the constituent material of the emissive layer 5) content of the liquid material, the speed of the solvent removal, atmosphere used in the remove of the solvent and surface nature of an under layer to which the liquid material is supplied.

For example, the atmosphere used in the remove of the solvent preferably includes atmosphere of a polar solvent because the complex can be more securely collected in the upper side of the liquid film. As such polar solvent, for example, water and alcohol such as methanol, ethanol, isopropanol and the like can be used.

Furthermore, it is preferred that the solvent is removed while convection is generated in the liquid film. In this way, the complex can be more securely collected in the upper side of the liquid film. Moreover, in this case, it is possible to prevent the first organic polymer from being prohibited (disturbed) from gathering on the anode 3 side because the affinity improvement treatment is performed to the upper face of the anode 3.

This convection can be generated by heating the liquid film, giving supersonic vibration to the substrate 2, applying droplets (liquid material) to which the supersonic vibration is given and the like. However, heating the liquid film is most preferable because it is relatively easy to adjust (control) the convection in the liquid film.

In this case, heating temperature is preferably from B-100° C. to B-10° C., more particularly about B-100° C. to B-25° C. where B [° C.] is the boiling point of the solvent.

4. Next, the cathode 6 is formed on the emissive layer 5.

The cathode 6 can be formed by, for example, the vacuum deposition, the sputtering, bonding of a metal foil and the like.

5. Then, the sealing member 7 is overlaid so as to cover the anode 3, the hole transfer layer 4, the emissive layer 5 and the cathode 6, and then the sealing member 7 is jointed to the substrate 2.

Though the above-described processes, the light-emitting element 1 of the invention is manufactured.

Any-purpose layer may be provided in the light-emitting element 1 at least one of the spaces between the anode 3 and the hole transfer layer 4, between the hole transfer layer 4 and the emissive layer 5, and between the hole transfer layer 4 and the cathode 6.

For example, an interlayer having a function of promoting the electron injection into the emissive layer 5 may be provided between the emissive layer 5 and the cathode 6. The light-emitting element 1 can improve its luminous efficiency with this interlayer. The interlayer may also serve so as to prevent or inhibit the hole transfer layer 4 from contacting with the cathode 6.

It is preferred that the interlayer is made of a material with a higher conduction band energy level (the bottom electric potential) than that of the constituent material (the inorganic semiconductor material in this embodiment) of the emissive layer 5. In this way, it is possible to move the electrons in a cascade manner (smoothly) from the cathode 6 to the emissive layer 5 (the light emitting material). In other words, it is possible to efficiently inject (transfer) the electrons into the emissive layer 5. Consequently, the luminous efficiency of the light-emitting element 1 is improved.

Material to form the interlayer is not especially limited as long as it satisfies the above-mentioned condition. For example, organic or inorganic semiconductor material alone, or complex of organic or inorganic semiconductor material and a chemical compound having an electron-attractant group can be used to form the interlayer.

When the semiconductor material is in a particulate form (a semiconductor material particle), at least a part of the semiconductor material particle is preferably covered (modified) with the chemical compound having an electron-attractant group to form the above-mentioned complex.

Accordingly, it is possible to adjust the conduction band energy level of the semiconductor material by selecting the type of the chemical compound having an electron-attractant group.

As such chemical compound having an electron-attractant group, fluorocarbon series silane coupling chemical compound such as $CF_3(CF_2)_7(CH_2)_2(CH_3)_2Si(CH_2)_5SiCl_3$:F17, $CF_3(CF_2)_3(CH_2)_2(CH_3)_2Si(CH_2)_9SiCl_3$:F9 and $CF_3(CH_2)_2(CH_3)_2Si(CH_2)_{12}SiCl_3$:F3 can be preferably used.

In order to make the complex (coating) of the chemical compound and the semiconductor material, for example, the chemical compound is vaporized and the semiconductor material is exposed to its vapor (a vapor phase method), or the semiconductor material is exposed to the liquid containing the chemical compound (a liquid phase method).

An average thickness of the interlayer is preferably about 1-50 nm, more particularly, 5-30 nm.

Though the carrier transfer layer is the electron hole transfer layer in this embodiment, the carrier transfer layer may be an electron transfer layer.

In this case, for example, oxadiazole series polymer, triazole series polymer and the like can be used as the organic polymer composing the electron transfer layer.

The above-described light-emitting element 1 can be used as, for example, a light source and the like. If a plurality of the light-emitting elements 1 is arranged in matrix, a display device (of the invention) can be formed.

A driving method of the display device is not particularly limited. Either an active matrix method or a passive matrix method can be applied.

Next, an example of the display device according to the invention will be described.

Figure 4:
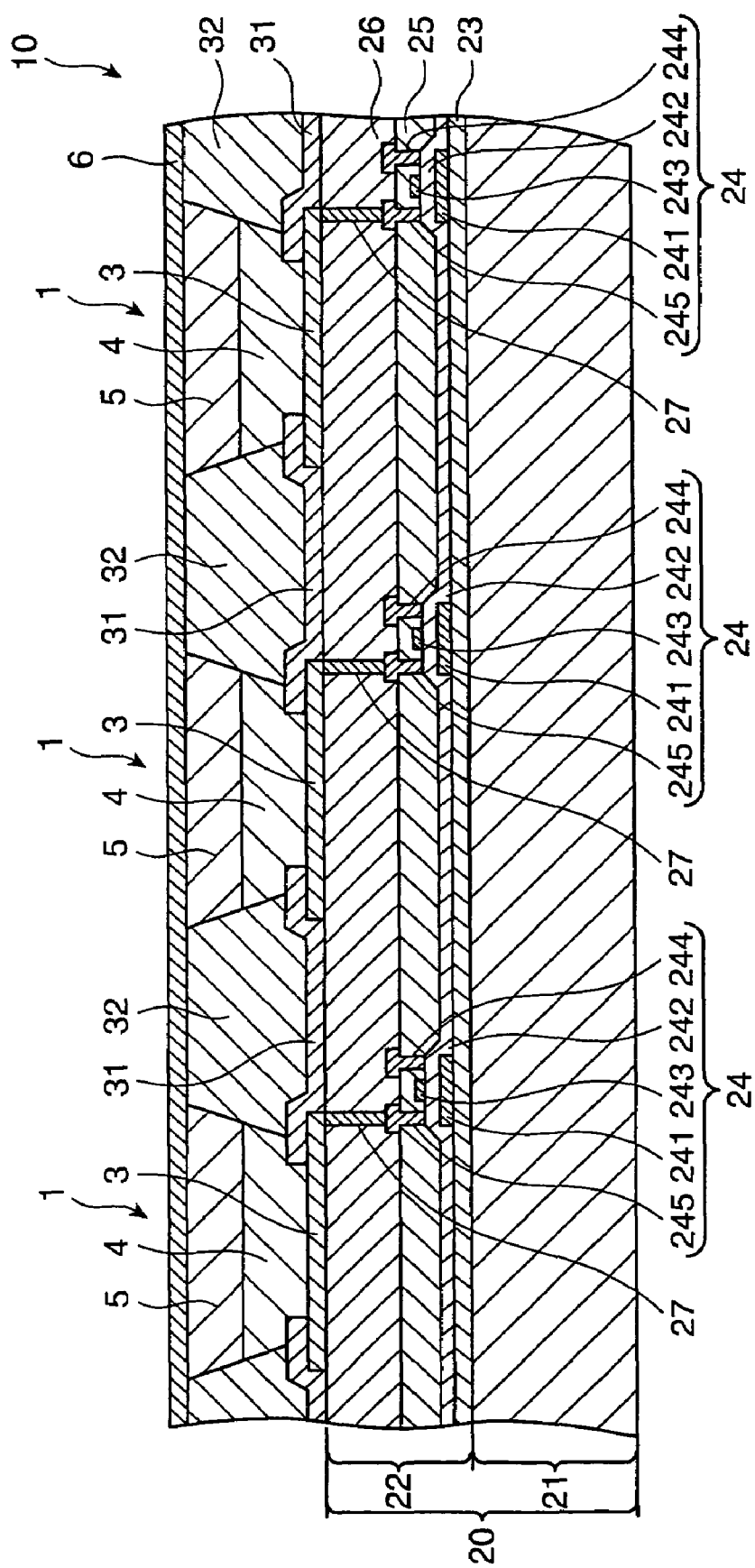
FIG. 4 is a schematic longitudinal sectional view of a display device to which a display device according to an embodiment of the invention is applied.

FIG. 4 is a schematic longitudinal sectional view of a display device to which a display device according to an embodiment of the invention is applied.

A display device 10 shown in FIG. 4 includes a base body 20 and the plurality of the light-emitting elements 1 provided on the base body 20.

The base body 20 has a substrate 21 and a circuit part 22 formed on the substrate 21.

The circuit part 22 has a protection layer 23 that is made of, for example, oxide silicon and formed on the substrate 21, a driving TFT 24 (a switching element) formed on the protection layer 23, a first interlayer insulating layer 25 and a second interlayer insulating layer 26.

The driving TFT 24 has a semiconductor layer 241 made of silicon, a gate insulating layer 242 formed on the semiconductor layer 241, a gate electrode 243 formed on the gate insulating layer 242, a source electrode 244 and a drain electrode 245.

Each light-emitting element 1 is provided above the circuit part 22 corresponding to each driving TFT 24. Two adjacent light-emitting elements 1 are separated by a first separation wall part 31 and a second separation wall part 32.

In this embodiment, the anode 3 in each light-emitting element 1 serves as a pixel electrode that is electrically coupled with the drain electrode 245 in each driving TFT 24 through a wiring 27. The cathode 6 in each light-emitting element 1 is coupled with a common electrode.

Each light-emitting element 1 is sealed with the sealing member (not shown in the figure) jointed with the base body 20 so as to cover the light-emitting element 1.

The display device 10 may be an monochrome display or a color display by selecting the light emitting material used for each light-emitting element 1.

Such display device 10 (of the invention) may be embedded with various kinds of electronic equipment.

Figure 5:
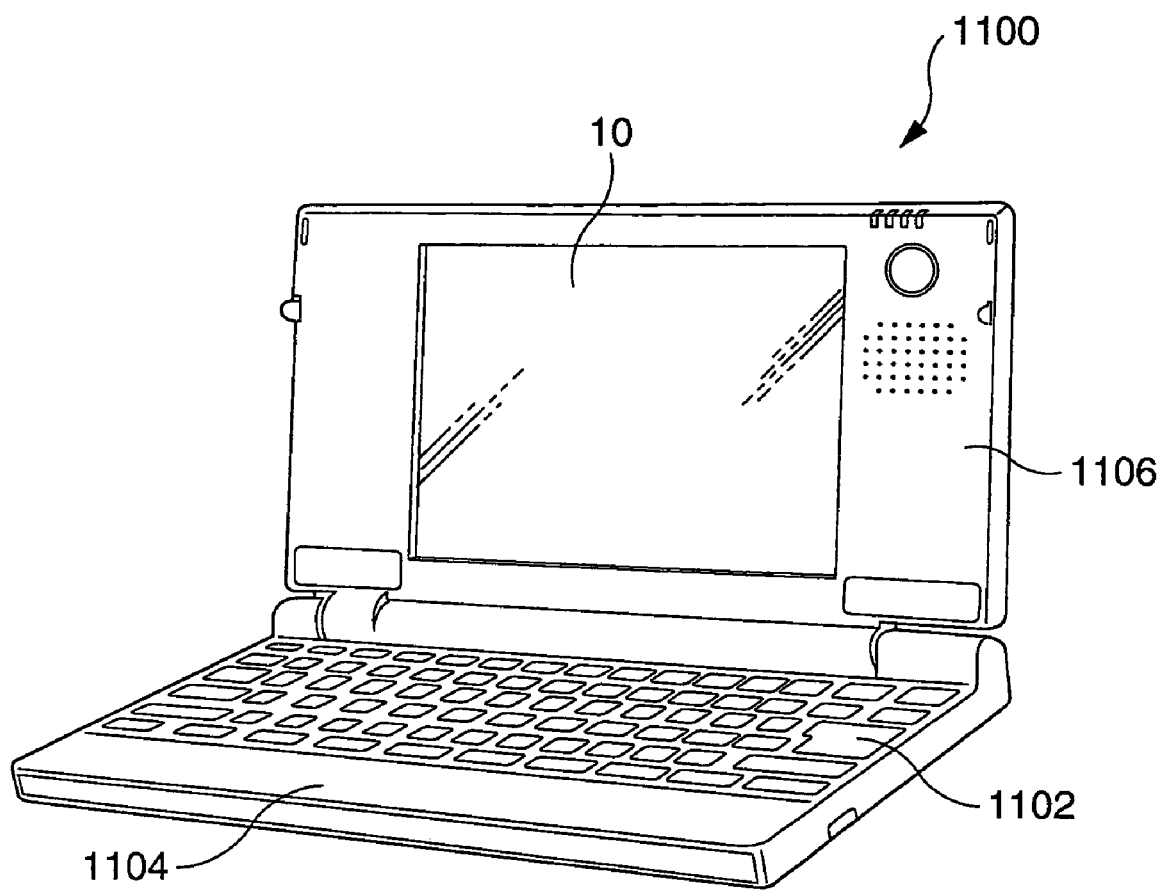
FIG. 5 is a perspective view of a mobile (laptop) type personal computer to which electronic equipment of the invention is applied.

FIG. 5 is a perspective view of a mobile type (or laptop) personal computer showing its structures.

The personal computer 1100 is composed of a main body part 1104 having a keyboard 1102 and a display device unit 1106 having the display device as shown in the figure. The display unit 1106 is supported rotatable by the computer body 1104 via a hinge mechanism.

A display part of the display device unit 1106 is the above-described display device 10 in this personal computer 1100.

Figure 6:
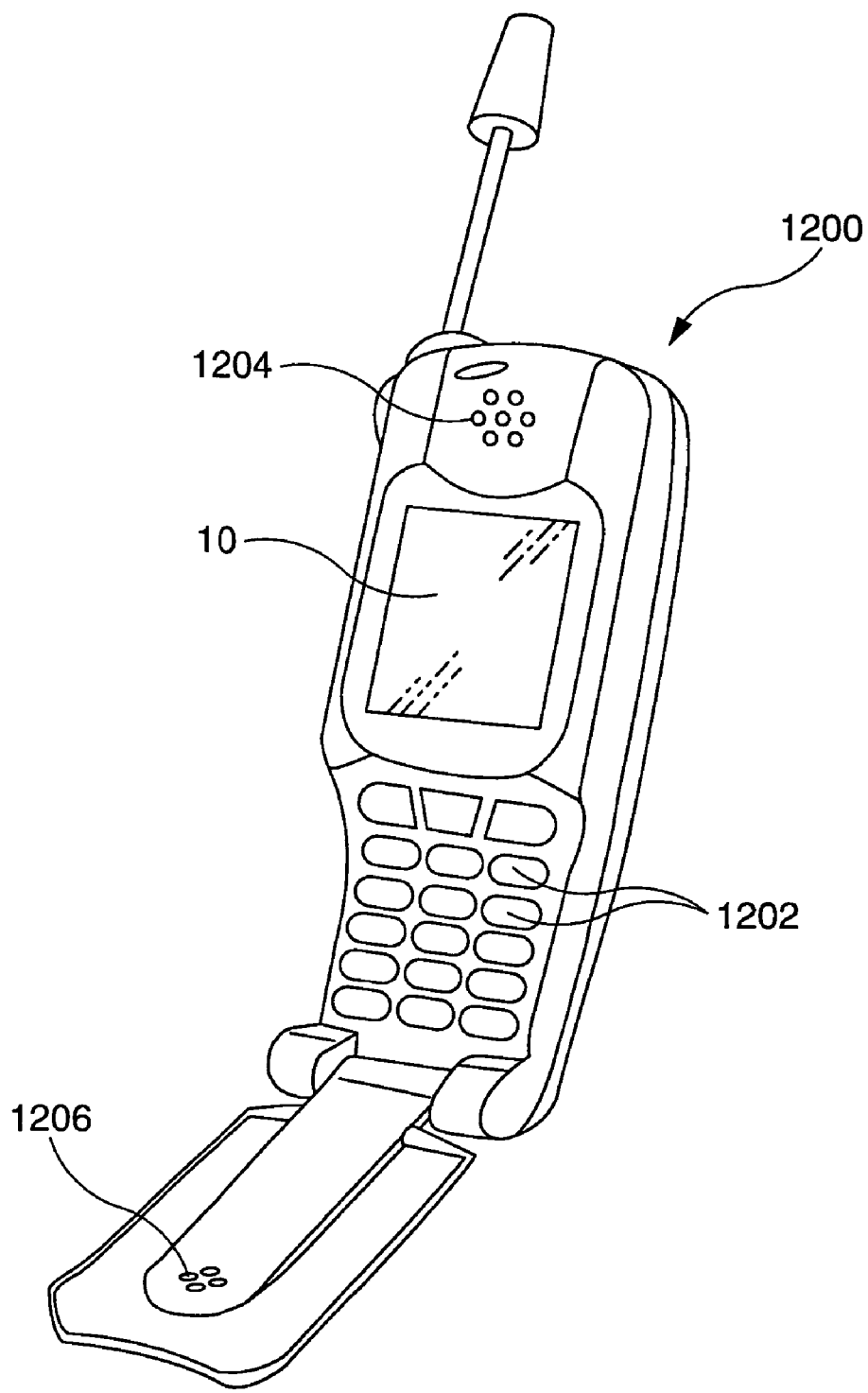
FIG. 6 is a perspective view of a mobile phone (including personal handyphone system) to which electronic equipment of the invention is applied.

FIG. 6 is a perspective view showing the configuration of a mobile phone (including a PHS) which is another example of electronic equipment provided with the electronic equipment according to the invention.

In the figure, a mobile telephone 1200 has a plurality of operation buttons 1202, an ear piece 1204 and a mouth piece 1206, and a display part.

The display part is the above-described display device 10 in this mobile telephone 1200.

Figure 7:
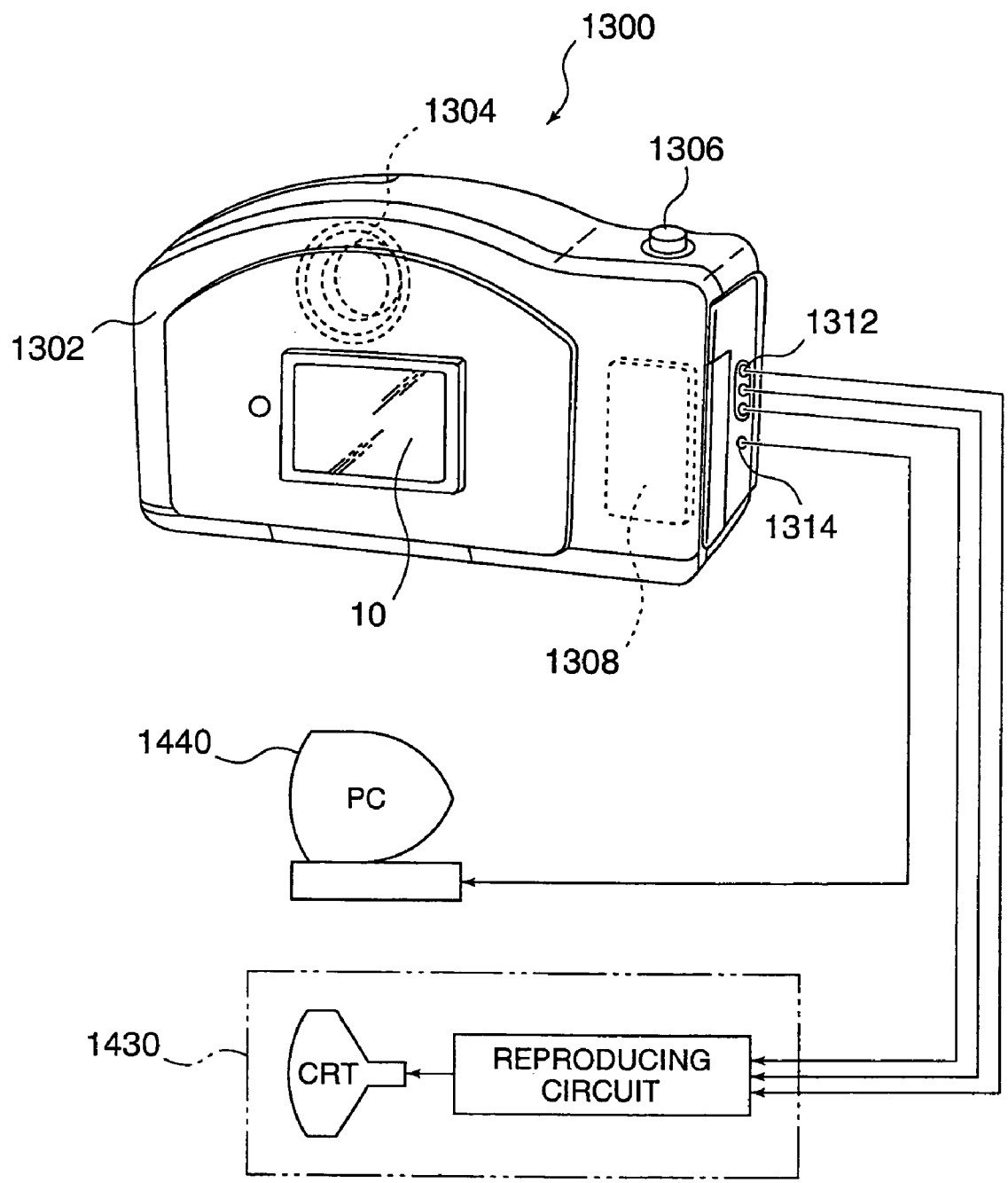
FIG. 7 is a perspective view of a digital still camera to which electronic equipment of the invention is applied.

FIG. 7 is a perspective view of a digital still camera to which electronic equipment of the invention is applied. In the figure, the connection with external equipment is shown in a simplified manner.

Here, in contrast to ordinary cameras in which a silver salt photographic film is photosensitized by an optical image of an object, a digital still camera 1300 creates an image signal (picture signal) by photoelectrically converting the optical image of the object by an imaging element such as a CCD (charge coupled device).

A display part provided on the back face of a case (body) 1302 of the digital still camera 1300 performs display based on the signal imaged by the CCD, and the display part serves as a finder which displays the object as an electronic image.

The display part is the above-described display device 10 in this digital still camera 1300.

A circuit substrate 1308 is provided in the case. The circuit substrate 1308 has a memory that can store (memorize) the image signal.

A light receiving unit 1304 which includes an optical lens (imaging optics), the CCD and the like are provided on the front side (back side in the figure) of the case 1302.

When a photographer confirms the object image displayed on the display part and presses the shutter button 1306, the image signal of the CCD at that moment is transferred to the memory on the circuit substrate 1308 and is stored therein.

In the digital still camera 1300, a video signal output terminal 1312 and an input/output terminal 1314 are provided on a side face of the case 1302. Besides, as shown in the figure, a television monitor 1430 and a personal computer 1440 are connected to the video signal output terminal 1312 and the input/output terminal 1314 for data communication, respectively, as needed. Moreover, the system is configured such that imaged signals stored in the memory of the circuit substrate 1308 are outputted to the television monitor 1430 or the personal computer 1440 by a predtermied operation.

Other examples of the electronic equipment according to the present invention include, in addition to the personal computer (mobile type personal computer) in FIG. 5, the mobile telephone in FIG. 6 and the digital still camera in FIG. 7, a television, a video camera, a viewfinder type or a monitor-direct type video tape recorder, a laptop personal computer, a car navigation device, a pager, an electronic notebook (including one with communication function), an electronic dictionary, a desktop calculator, an electronic game machine, a word processor, a work station, a video telephone, a crime prevention video monitor, an electronic binocular, a Point of Sale (POS) terminal, medical equipment (for example, an electronic clinical thermometer, a blood pressure gauge, a blood sugar meter, an electrocardiogram measurement instrument, ultrasonic diagnostic equipment and an electronic endoscope), a fish finder, various kinds of measurement equipment, instruments (for example, instruments for train, aircraft and ship), a flight simulator, other various kinds of monitors, a projection type display device such as a projector and the like.

Although the method of manufacturing a light-emitting element, the light-emitting element, the display device and the electronic equipment according to the invention have been fully described by way of examples with reference to the accompanying drawings, it is to be. understood that the embodiments described hereunder do not in any way limit the scope of the invention.

Hereinafter, specific examples of the present invention will be described.

EXAMPLE 1

The luminous efficiency and the durability (life) of the light-emitting element manufactured in the following processes are evaluated.

Sample No. 1A (1A) Firstly, a transparent glass substrate with the average thickness of 0.5 mm is prepared.

(2A) Secondly, an indium tin oxide (ITO) electrode (anode) with the average thickness of 100 nm is formed on the substrate by the sputtering method.

(3A) Thirdly, an ethanol solution of 0.1 wt % $NH_2(CH_2)_5 SiCl_3$ (silane coupling agent) is applied by the spin coat method (2000 rpm), and then it is dried.

(4A) Fourthly, the liquid material is prepared by adding the polyphenylamine series polymer (weight-average molecular weight is 4000) shown in Formula 1 as the first organic polymer, the polyfluorene series polymer (weight-average molecular weight is 5000) shown in Formula 2 as the second organic polymer and oxide zirconium particles coated with the iridium complex as the constituent material of the emissive layer into xylene.

The polyphenylamine series polymer content of the liquid material is 0.5 wt %, the polyfluorene series polymer content of the liquid material is 0.5 wt %, and the content of the oxide zirconium particles coated with the iridium complex is 2.0 wt %.

The average diameter of the oxide zirconium particle is 5 nm.

Threefold coordinate iridium metal complex having 2,2'-bipyridine-4,4'-dicarboxylic acid as its ligand shown in Formula 3 is used as the iridium complex.

This liquid material is applied on the ITO electrode by the spin coat method (2000 rpm) and then dried. In this way, the electron hole transfer layer (the first region and the second region) and the emissive layer are formed by the phase separation.

The drying condition of the liquid material is in an isopropanol atmosphere at 50° C. At this temperature, the convection is generated in the liquid film.

(5A) Fifthly, as the constituent material of the interlayer, the dispersion liquid is prepared by dispersing the oxide zirconium particles coated with F17 (fluorocarbon series silane coupling chemical compound) into isopropanol.

This dispersion liquid is applied to the emissive layer by the spin coat method (2000 rpm), and then dried. In this way, the interlayer with the average thickness of 10 nm is formed.

The average diameter of the oxide zirconium particle is 5 nm.

(6A) Next, AlLi electrode (cathode) with the average thickness of 300 nm is formed on the interlayer by the vacuum deposition.

Then, a protection cover (the sealing member) made of polycarbonate is provided so as to cover the formed layers.

The cover is fixed with ultraviolet cure resin, and the components are sealed. Finally, the light emitting material is completed.

Sample No. 2A

A light-emitting element of Sample No. 2A is formed in the same way as the above-described Sample No. 1A excepting that the silane coupling agent shown in Formula 4 below is used in the above-described process (3A).

Formula 4

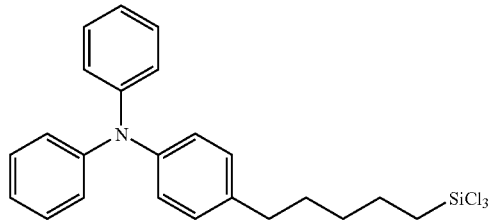

Sample No. 3A

A light-emitting element of Sample No. 3A is formed in the same way as the above-described Sample No. 1A excepting that the process (3A) is omitted.

The luminous efficiency and the durability (life) of the light-emitting elements of Samples No. 1A though No. 3A man are evaluated.

The evaluation of the luminous efficiency is carried out by applying the voltage from 0V to 6V, determining the current and measuring the luminance with a luminance meter. The evaluation of the durability is performed by driving the element with a constant current with an initial luminance of 400 cd/m$^2$.

It turned out that the luminance efficiency of the light-emitting elements of Sample No. 1A and 2A (the present invention) increased by 1.3 times that of Sample No. 3A (a comparison example).

It is also verified that a luminous half-life period of the light-emitting elements of Sample No. 1A and 2A (the invention) extended by about 1.5 times that of Sample No. 3A (a comparative example).

When the first organic polymer is selected from polyallylamine, fuluorene-allylamine copolymer or these derivatives, the second organic polymer is selected from polyfluorene, fuluorene-bithiophene copolymer or these derivatives, and the light-emitting element is manufactured in the above-described way, the same advantageous effects mentioned above can be obtained.

EXAMPLE 2

Five evaluation objects are formed with respect to each sample in the hereinafter described way. Separation condition of each layer and the thickness are observed.

Sample No. 1B

The evaluation objects are formed by performing the same processes as the above-described processes (1A) through (4A) of Sample No. 1A.

Sample No. 2B

The evaluation objects are formed by performing the same processes as the above-described processes (1A) through (4A) of Sample No. 2A.

Sample No. 3B

The evaluation objects are formed by performing the same processes as the above-described processes (1A) through (4A) of Sample No. 3A.

The separation condition of the layers in the first region, the second region and the emissive layer is observed with respect to Sample No. 1B through Sample No. 3B. The thickness is also measured.

This is carried out by scratching the multi-layered member that consists of the first region, the second region and the emissive layer from the emissive layer side with a pin, observing a separated part with a fluorescence microscope (type "BX 50" manufactured by Olympus Corporation). The thickness is measured by a step gauge ("P-10" manufactured by KLA-Tencor).

Results of the thickness measurement of each layer are as follows. The value of the each layer thickness it the average of the five evaluation objects.

Sample No. 1B (equivalent to the invention): the first region is 33 nm, the second region is 35 nm, and the emissive layer is 22 nm.

Sample No. 2B (equivalent to the invention): the first region is 35 nm, the second region is 34 nm, and the emissive layer is 20 nm.

Sample No. 3B (equivalent to the comparative example): the first region is 28 nm, the second region is 45 nm, and the emissive layer is 18 nm.

With the fluorescence microscope observation, clear steps are confirmed in the evaluation objects in Sample No. 1B and Sample No. 2B. With the thickness measurement, it is confirmed that each layer is formed in a substantially desired thickness.

On the contrary, steps can be confirmed in the evaluation objects in Sample No. 3B with the fluorescence microscope observation. However, some of the steps are unclear. The thickness of each layer in the evaluation objects in Sample No. 3B is largely out of the desired range.

Considering these results, it is clear that the affinity improvement treatment can helps the more secured phase separation. These results may also be reflected in the property improvement of the light-emitting element described in Example 1.

Furthermore, evaluation objects are formed through the same processes but using different silane coupling agents, and it is confirmed that the separation condition of the layer is changeable by selecting the type of the silane coupling agent used for the affinity improvement treatment.

What is claimed is:

1. A method of manufacturing a light emitting element that includes a first electrode and a second electrode interposed by an emission layer and a carrier transfer layer, the carrier transfer layer including a first region formed directly adjacent to the first electrode and a second region formed between the first region and the light emission layer, the method comprising:

depositing a liquid material on the first electrode to form a liquid film, the liquid film including a first organic polymer and a second organic polymer that are dissolved in a solvent, and a complex of a semiconductor particle and a light emitting material dispersed in the solvent, a molecular weight of the first organic polymer being greater than that of the second organic polymer; and removing the solvent from the liquid film such that the first organic polymer is formed in the first region, the second organic polymer is formed in the second region and the complex of the semiconductor particle and the light emitting material forms the emission layer directly adjacent to the second electrode, the emission layer including the semiconductor particle and the light emitting material.

2. The method of manufacturing the light emitting element according to claim 1, the removing of the solvent from the liquid film including removing the solvent while generating convection.

3. The method of manufacturing the light emitting element according to claim 1, the method further comprising:
conducting a surface treatment on a side of the first electrode on which the first organic polymer is to be formed to improve an affinity of the first organic polymer and the first electrode before the depositing of the liquid material on the first electrode.

4. The method of manufacturing the light emitting element according to claim 1, the first organic polymer and the second organic polymer overlapping each other in a convex-concave form.

5. The method of manufacturing the light emitting element according to claim 1, the first organic polymer having an average molecular weight in a range of 15,000 to 50,000.

6. The method of manufacturing the light emitting element according to claim 1, the second organic polymer having an average molecular weight in a range of 1,500 to 5,000.

7. The method of manufacturing the light emitting element according to claim 1, the light emitting material covering at least a portion of the semiconductor particle.

8. The method of manufacturing the light emitting element according to claim 7, the method further comprising:
forming an interlayer on the emission layer before the forming of a second electrode.

9. The method of manufacturing the light emitting element according to claim 8, the interlayer being formed of a material having a higher conduction band energy level than the semiconductor material.

10. The method of manufacturing the light emitting element according to claim 1, the method further comprising:
depositing a sealing member on the light emitting element such that the sealing member covers the second electrode, a part of the light emission layer, and a part of the carrier transfer layer.

11. The method of manufacturing the light emitting element according to claim 1, the solvent including an apolar solvent.

12. The method of manufacturing the light emitting element according to claim 1, the first organic polymer including at least one of a polyallylamine, fuluorene-allylamine copoloymer or derivative thereof.

13. The method of manufacturing the light emitting element according to claim 1, the second organic polymer including at least one of polyfluorene, fluluorene-bithiophene copolymer or derivative thereof.

14. The method of manufacturing the light emitting element according to claim 1, the semiconductor particle having an average diameter of 1-7 nm.

15. The method of manufacturing the light emitting element according to claim 1, the light emitting material including an organic polymer, an average molecular weight of the organic polymer being greater than that of the carrier transfer layer.

16. The method of manufacturing the light emitting element according to claim 3, the conducting of the surface treatment including a chemical modification process.

17. The method of manufacturing the light emitting element according to claim 1, the semiconductor particle being inorganic.

18. A method of manufacturing a light emitting element that includes a first electrode and second electrode interposed by an emission layer and a carrier transfer layer, the carrier transfer layer including a first region formed directly adjacent to the first electrode and a second region formed between the first region and the light emission layer, the method comprising:
depositing a liquid material on the first electrode to form a liquid film, the liquid film including a first organic polymer, a second organic polymer that are dissolved in a solvent and a complex of a semiconductor particle and a light emitting material dispersed in the solvent, the first organic polymer having a larger band gap than the second organic polymer; and
removing the solvent from the liquid film such that the first organic semiconductor material is formed in the first region, a second organic polymer is formed in the second region and the complex of the semiconductor particle and the light emitting material forms the emission layer directly adjacent to the second electrode, the emission layer including the semiconductor particle and the light emitting material.

19. The method of manufacturing the light emitting element according to claim 18, the removing of the solvent from the liquid film including removing the solvent while generating convection.

20. The method of manufacturing the light emitting element according to claim 18, the semiconductor material being organic.

21. A method of manufacturing a display device comprising the light emitting element according to claim 1.

22. A method of manufacturing an electronic equipment comprising the display device according to claim 21.

23. A method of manufacturing a light emitting element that includes a first electrode and a second electrode interposed by an emission layer and a carrier transfer layer, the carrier transfer layer including a first region formed directly adjacent to the first electrode and a second region formed between the first region and the light emission layer, the method comprising:
depositing a liquid material on the first electrode to form a liquid film, the liquid film including a first organic polymer, a second organic polymer that are dissolved in a solvent and a light emitting material dispersed in the solvent; and
removing the solvent from the liquid film such that the first organic semiconductor material is formed in the first region, a second organic polymer is formed in the second region and the light emitting material forms the emission layer directly adjacent to the second electrode.

24. The method of manufacturing the light emitting element according to claim 23, the first region, the second region and the carrier transfer layer being formed simultaneously by a phase separation method.

* * * * *